(12) United States Patent
Arai (10) Patent No.: US 8,729,386 B2
(45) Date of Patent: May 20, 2014

(54) SEMICONDUCTOR DEVICE AND MANUFACTURING METHOD THEREOF

(75) Inventor: Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/252,292

(22) Filed: Oct. 4, 2011

(65) Prior Publication Data

US 2012/0017984 A1    Jan. 26, 2012

Related U.S. Application Data

(62) Division of application No. 11/652,618, filed on Jan. 12, 2007, now Pat. No. 8,049,103.

(30) Foreign Application Priority Data

Jan. 18, 2006   (JP) .................................. 2006-009945

(51) Int. Cl.
  *H01L 31/028*   (2006.01)
  *H01L 31/036*   (2006.01)

(52) U.S. Cl.
  USPC ........... 136/261; 136/258; 136/262; 136/252; 136/255; 438/89

(58) Field of Classification Search
  USPC ................................................ 136/243–365
  See application file for complete search history.

(56) References Cited

U.S. PATENT DOCUMENTS

| | | | |
|---|---|---|---|
| 3,636,492 A | 1/1972 | Yamashita et al. | |
| 4,947,219 A | 8/1990 | Boehm | |
| 5,700,333 A | 12/1997 | Yamazaki et al. | |
| 6,086,945 A | 7/2000 | Kamata et al. | |
| 6,246,524 B1 | 6/2001 | Tanaka | |
| 6,281,427 B1 * | 8/2001 | Mitsuhiro et al. | 136/250 |
| 6,287,888 B1 | 9/2001 | Sakakura et al. | |
| 6,563,041 B2 * | 5/2003 | Sugawara et al. | 136/250 |
| 7,221,340 B2 | 5/2007 | Matsuda et al. | |
| 2002/0134420 A1 | 9/2002 | Kyoda et al. | |
| 2005/0061363 A1 * | 3/2005 | Ginley et al. | 136/252 |
| 2005/0236030 A1 | 10/2005 | Sugawara et al. | |
| 2008/0000520 A1 | 1/2008 | Uchida et al. | |

FOREIGN PATENT DOCUMENTS

| | | |
|---|---|---|
| EP | 0 993 050 A2 | 4/2000 |
| JP | 03-228379 | 10/1991 |
| JP | 05-048126 | 2/1993 |
| JP | 07-142749 | 6/1995 |
| JP | 2641800 | 5/1997 |
| JP | 2641800 | 8/1997 |
| JP | 10-012908 * | 1/1998 |
| JP | 10-012908 A | 1/1998 |
| JP | 10-163113 | 6/1998 |
| JP | 11-260721 | 9/1999 |
| JP | 2000-091625 | 3/2000 |
| JP | 2000-101109 | 4/2000 |
| JP | 2004-186320 | 7/2004 |
| JP | 2004-342693 | 12/2004 |
| JP | 2005-159167 | 6/2005 |
| JP | 2006-156582 | 6/2006 |

* cited by examiner

*Primary Examiner* — Jayne Mershon (74) *Attorney, Agent, or Firm* — Nixon Peabody LLP; Jeffrey L. Costellia (57) ABSTRACT

A semiconductor device is provided, which comprises a first electrode, crystalline semiconductor particles, a semiconductor layer, and a second electrode. The crystalline semiconductor particles of which adjacent particles are fusion-bonded, the crystalline semiconductor particles have a first conductivity type, and the semiconductor layer has a second conductivity type which is different from the first conductivity type.

22 Claims, 11 Drawing Sheets

SEMICONDUCTOR DEVICE AND MANUFACTURING METHOD THEREOF

BACKGROUND OF THE INVENTION

1. Field of the Invention

The present invention relates to a photoelectric conversion device that converts light energy into electrical energy, and particularly relates to a photoelectric conversion device using crystalline semiconductor particles and a manufacturing method thereof.

2. Description of the Related Art

Solar cells with high conversion efficiency using monocrystalline or polycrystalline silicon wafers have been put to practical use. In particular, in response to global environmental issues in recent years, the market for residential photovoltaic systems and the like has expanded.

These solar cells are manufactured by being cut out of large silicon ingots. However, it takes a long time to manufacture large silicon ingots, which means productivity is low, and since supply of raw material of silicon itself is limited, the supply of silicon ingots is insufficient and cannot respond to the expansion of the market for solar cells.

Although amorphous silicon solar cells are known as solar cells that do not use large silicon ingots, conversion efficiency after stabilization remains low, and are unsuited to function as electrical power.

As a photoelectric conversion device that does not need a large silicon ingot, a photoelectric conversion device using silicon crystalline particles has been suggested (for examples, refer to Patent Document 1: Japanese Patent No. 2641800 and Patent Document 2: Japanese Published Patent Application No. 2005-159167). This photoelectric conversion device is based on a structure of providing and fixing a large number of one-conductivity type semiconductor particles over a substrate provided with a lower electrode or a substrate that becomes a lower electrode, and then forming a semiconductor layer that has an opposite conductivity type to the one-conductivity type, so that a p-n junction is formed.

SUMMARY OF THE INVENTION

However, with the conventional photoelectric conversion device using semiconductor particles, a photoelectric conversion layer is formed by dispersing individual semiconductor particles; consequently, there exists a problem that an area which contributes to photoelectric conversion substantively is reduced. That is, compared to the conventional solar cells manufactured from silicon ingots, there is a problem that conversion efficiency per unit area is reduced.

In view of the foregoing problem, an object of the present invention is to provide a photoelectric conversion device with high conversion efficiency and favorable productivity, and a manufacturing method thereof.

A photoelectric conversion device of the present invention is a photoelectric conversion device using one-conductivity type or intrinsic crystalline semiconductor particles of which adjacent particles are fusion-bonded to each other. A junction in this photoelectric conversion layer is formed of the one-conductivity type or intrinsic crystalline semiconductor particles of which adjacent particles are fusion-bonded to each other, and a semiconductor layer that has an opposite conductive type to the one-conductivity type. The one-conductivity type or intrinsic crystalline semiconductor particles of which adjacent particles are fusion-bonded to each other may be stacked to form a crystalline semiconductor particle layer.

By using the one-conductivity type or intrinsic crystalline semiconductor particles of which adjacent particles are fusion-bonded to each other, it can be made so that movement of photogenerated carriers in a light-accepting flat surface direction (lateral direction) is not inhibited. Also, by leaving a shape of the crystalline semiconductor particles as is, an acceptance surface of the photoelectric conversion device can be made to be irregular.

According to the present invention, by using the one-conductivity type or intrinsic crystalline semiconductor particles of which adjacent particles are fusion-bonded to each other, movement of the photogenerated carriers in the light-accepting flat surface direction (lateral direction) is not inhibited, and efficiency of carrier collection is improved; consequently, photoelectric conversion efficiency can be improved. Further, since a p-n junction is formed while retaining the shape of the crystalline semiconductor particles, area of light acceptance that substantively contributes to photoelectric conversion is increased, which contributes to improving conversion efficiency.

The photoelectric conversion device of the present invention can be used as a solar cell for electrical power that is installed outdoors. In that case, since a large-area photoelectric conversion device can be manufactured without using a large silicon ingot, raw material of silicon is not wastefully consumed. Also, in addition to using for electrical power, the photoelectric conversion device can be used as a low electric power source for consumer appliances such as a calculator, a clock, and the like.

DETAILED DESCRIPTION OF THE INVENTION

Embodiment Mode

Embodiment modes of the present invention will hereinafter be described in detail based on the accompanying drawings. However, the present invention is not limited to the description below, and it is easily understood by those skilled in the art that modes and details herein disclosed can be modified in various ways without departing from the spirit and the scope of the present invention. Therefore, the present invention should not be interpreted as being limited to the description of the embodiment modes to be given below. Note that in the structure of the present invention described hereinafter, reference numerals denoting the same portions are used in common in the drawings, and repeated description thereof may be omitted.

(Embodiment Mode 1)

FIGS. 1 to 4 describe manufacturing steps of a photoelectric conversion device of this embodiment mode. In this embodiment mode, an example of manufacturing a photoelectric conversion device using crystalline semiconductor particles each with a grain diameter of several micrometers to several tens of micrometers (1 micrometer to 99 micrometers), in order to improve conversion efficiency, is described.

Figure 1:
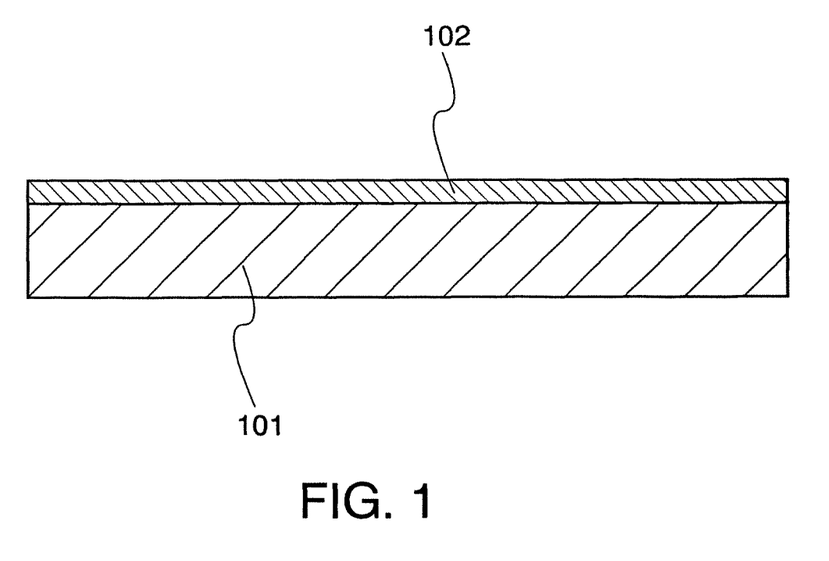
FIG. 1 describes a manufacturing step of a photoelectric conversion device of Embodiment Mode 1.

In FIG. 1, a first electrode 102 is formed over a substrate 101. It is acceptable as long as the substrate 101 can resist a temperature of about 500° C., and alumino borosilicate glass, barium borosilicate glass, or the like, which is called a non-alkali glass substrate; a quartz substrate; or a metal substrate such as a stainless steel substrate can be used. For the first electrode 102, a low melting metal such as aluminum (Al), indium (In), tin (Sn), or zinc (Zn) is preferably used. This is so that the crystalline semiconductor particles are fusion-bonded to each other in a later step. For example, tin (Sn) has a melting point of 232° C., and is also a tetratomic metal; therefore, it is preferable since it does not change a conductivity type of the crystalline semiconductor particles, in a fusion-bonding step.

Figure 2:
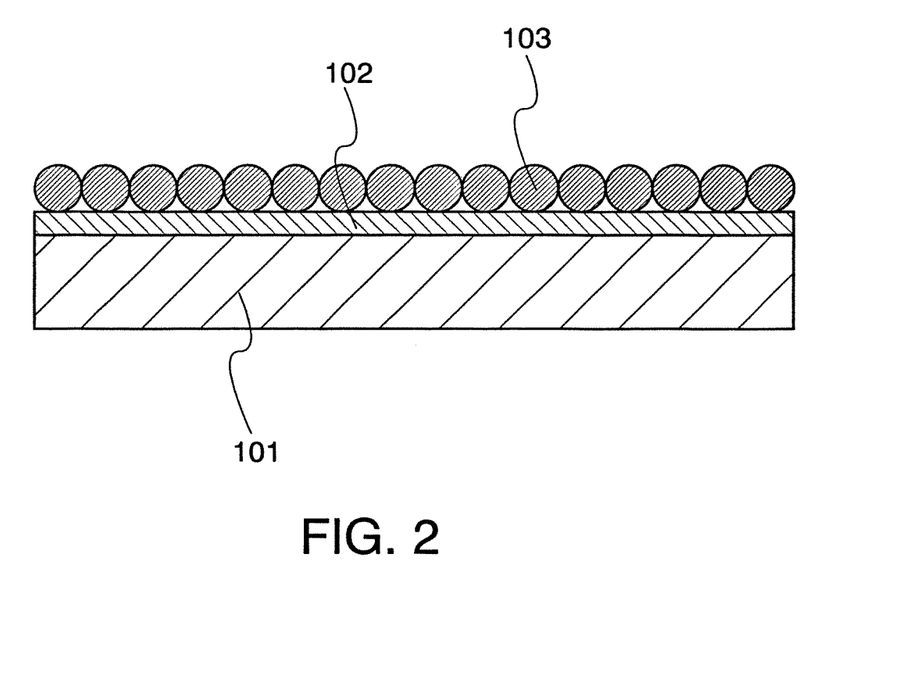
FIG. 2 describes a manufacturing step of a photoelectric conversion device of Embodiment Mode 1.

In FIG. 2, p-type crystalline semiconductor particles 103 each with a grain diameter of 5 μm to 30 μm are densely dispersed over the first electrode 102 formed of a low melting metal. Size of the particles may be appropriately selected taking into consideration the lifetime and a light absorption coefficient of a crystal. The crystalline semiconductor particles 103 are of silicon, germanium, silicon-germanium, or the like. In order to make the crystalline semiconductor particles 103 to be p-type, boron (B), aluminum (Al), or gallium (Ga) may be added for a purpose of controlling a valence electron. The crystalline semiconductor particles 103 can be formed by a vapor growth method, an atomizing method, a direct current plasma method, a melt drop method, or the like. It is preferable that grain diameters of the crystalline semiconductor particles are uniform.

Figure 3:
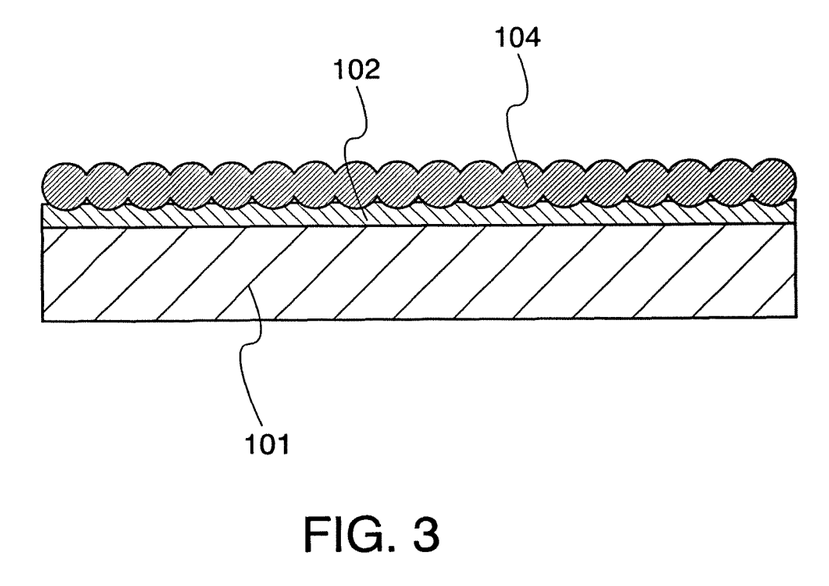
FIG. 3 describes a manufacturing step of a photoelectric conversion device of Embodiment Mode 1.

FIG. 3 shows a step of carrying out a heat treatment. The first electrode 102 is heated, and the crystalline semiconductor particles 103 are fixed thereto. That is, the first electrode 102 is heated to its melting point temperature, or a temperature at which liquefaction occurs, and the crystalline semiconductor particles 103 are fixed to the first electrode 102.

Further, a step is carried out in which a treatment of fusion-bonding the crystalline semiconductor particles 103 to each other, is carried out. By fusion-bonding the crystalline semiconductor particles 103 to each other, an area for absorbing light increases within a substrate surface. Crystalline semiconductor particles 104 that are fusion-bonded allow diffusion of photogenerated carriers to an adjacent crystalline semiconductor particle, and therefore efficiency of carrier collection is improved. That is, since the area substantively contributing to photoelectric conversion increases by this step, conversion efficiency can be improved.

The treatment of fusion-bonding the crystalline semiconductor particles 103 to each other may be of heating to, for example, 1412° C. which is the melting point of silicon, but the treatment is preferably laser beam irradiation. As a laser light source, a continuous wave (CW) laser of laser diode (LD) excitation ($YVO_4$, second harmonic (wavelength 532 nm)) can be used. Although it is not particularly necessary that the laser is limited to the second harmonic, the second harmonic is better than a harmonic of a higher order in terms of energy efficiency. When the crystalline semiconductor particles 103 are irradiated with the CW laser, energy is given continuously to a semiconductor film; consequently, a surface of the crystalline semiconductor particles 103 can be made to be in a fusion state for at least a certain period of time. Consequently, adjacent crystalline semiconductor particles 103 can be fusion-bonded to each other. Also, a reason for using a solid laser is because compared to a gas laser or the like, the solid laser has high stability of output, and stable treatment is expected. Note that other than the CW laser, a pulsed laser with a repetition frequency of 10 MHz or more can also be used.

If a pulse interval of the laser is at least shorter than the time it takes for the surface of the crystalline semiconductor particles 103 to solidify after fusion, a fusion-bonding reaction of the crystalline semiconductor particles 103 can be carried out continuously, and generation of a defect at an interface of fusion-bonding, which becomes a carrier trap, can be suppressed. Another CW laser or another pulsed laser with a repetition frequency of 10 MHz or more can also be used. For example, as a gas laser, an Ar laser, a Kr laser, a $CO_2$ laser, or the like is given. As a solid laser, a YAG laser, an YLF laser, $YAlO_3$ laser, a $GdVo_4$ laser, a KGW laser, a KYW laser, an alexandrite laser, a Ti:sapphire laser, a $Y_2O_3$ laser, a $YVO_4$ laser, or the like is given. Further, a YAG laser, a $Y_2O_3$ laser, a $GdVO_4$ laser, a $YVO_4$ laser, or the like is given as a ceramic laser. As a metal vapor laser, a helium cadmium laser or the like is given. Furthermore, an excimer laser of pulsed oscillation may be used.

Figure 4:
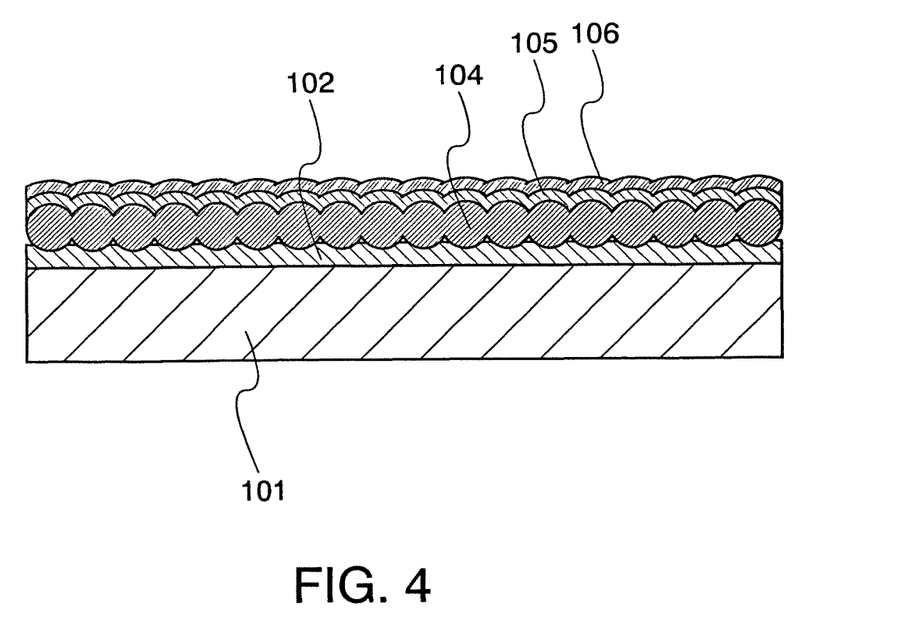
FIG. 4 describes a manufacturing step of a photoelectric conversion device of Embodiment Mode 1.

FIG. 4 shows a step of forming an n-type semiconductor layer 105 and a second electrode 106 over the crystalline semiconductor particles 104 that are fusion-bonded. The n-type semiconductor layer 105 is formed of polycrystalline silicon doped with phosphorus (P) or the like; microcrystalline silicon; amorphous silicon; or the like. The n-type semiconductor layer 105 is formed to have a thickness of 10 nm to 100 nm, and with this, a p-n junction is formed.

Over the n-type semiconductor layer 105, the second electrode 106 is formed. The second electrode 106 may be formed with a transparent conductive film made of indium oxide, indium tin oxide, zinc oxide, or the like. Alternatively, the second electrode 106 may be formed as a comb-shaped metal electrode. In this manner, the photoelectric conversion device can be obtained.

In the photoelectric conversion device of this embodiment mode, movement of carriers generated in crystalline semiconductor particles 107 in a lateral direction is not inhibited, and a significant effect is obtained where there is not much difference compared to a case of forming this layer from a single monocrystalline silicon layer. Also, in order to absorb sunlight as a photoelectric conversion device, it is said that a thickness of 10 micrometers is sufficient; however, according to the photoelectric conversion device of this embodiment mode, crystalline semiconductor particles each with a grain diameter of several micrometers to several tens of micrometers may be dispersed and fusion-bonded. Therefore, resource of silicon is not wastefully consumed.

(Embodiment Mode 2)

FIGS. 5 to 8 describe manufacturing steps of a photoelectric conversion device of this embodiment mode. In this embodiment mode, an example of manufacturing a photoelectric conversion device using finer crystalline semiconductor particles each with a grain diameter of several nanometers to several tens of nanometers (1 nanometer to 99 nanometers), in order to improve conversion efficiency, is described.

Figure 5:
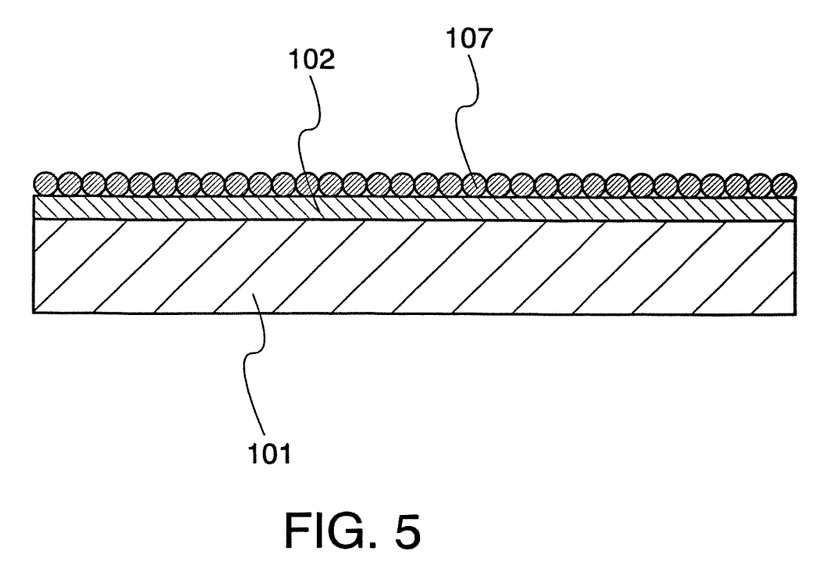
FIG. 5 describes a manufacturing step of a photoelectric conversion device of Embodiment Mode 2.

As shown in FIG. 5, the first electrode 102 is formed over the substrate 101 in a similar manner to Embodiment Mode 1. Then, the crystalline semiconductor particles 107 each with a grain diameter of several nanometers to several tens of nanometers are densely dispersed and formed over the first electrode 102. The crystalline semiconductor particles 107 are formed of silicon (Si), germanium (Ge) or the like, and the crystalline semiconductor particles 107 may contain boron (B) or aluminum (Al) which is p-type, or phosphorus (P) or arsenic (As) which is n-type.

The crystalline semiconductor particles 107 can be formed by an aerosol laser ablation method, a pyrolysis method, or a vapor growth method.

Figure 9:
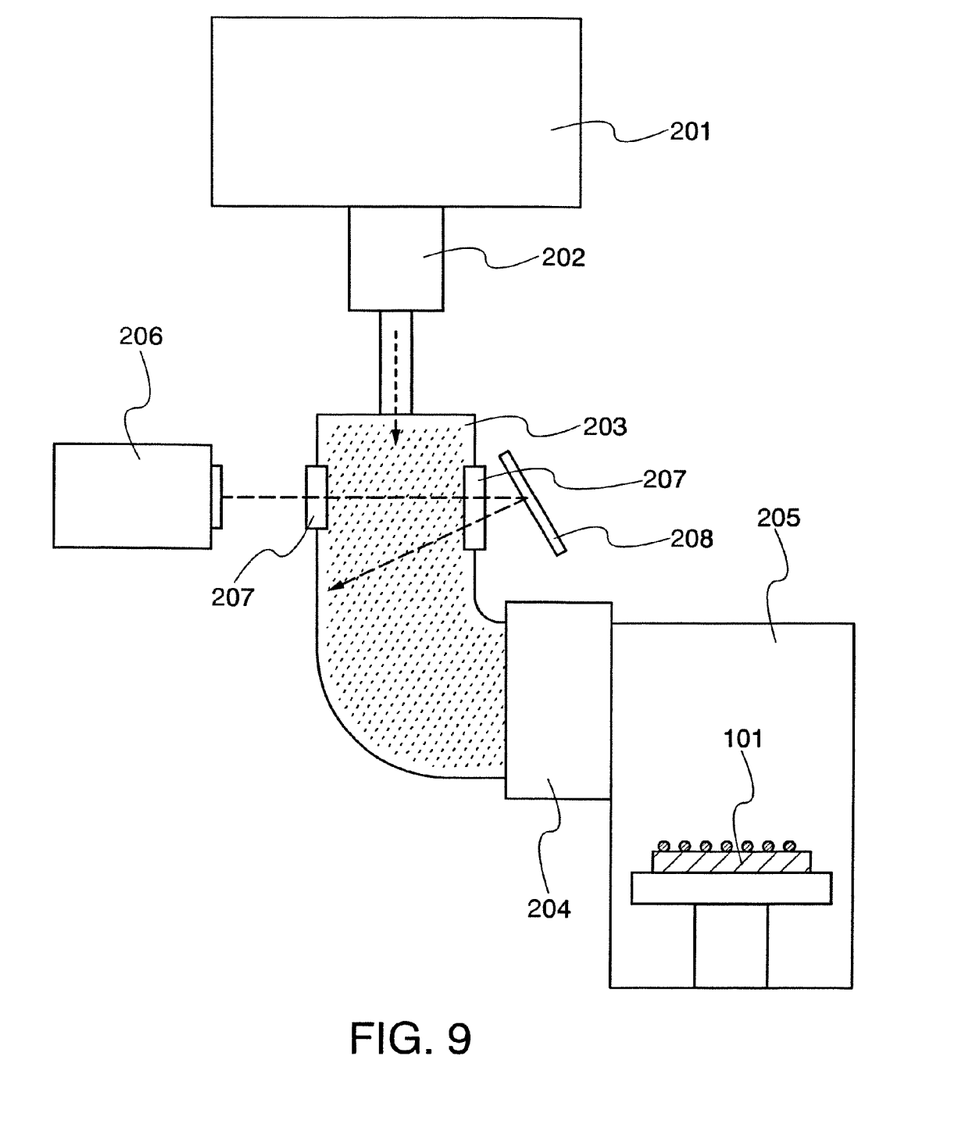
FIG. 9 shows a structure of an aerosol laser ablation for generating crystalline semiconductor particles.

FIG. 9 shows a structure of an aerosol laser ablation apparatus for generating crystalline semiconductor particles of this embodiment mode. The aerosol laser ablation method is a method of forming semiconductor particles of several nanometers to several hundred nanometers (1 nanometer to 999 nanometers) by transporting a raw material solution that is a solution in which semiconductor particles are dissolved or dispersed, aerosolizing the raw material solution by an atomizer, and then irradiating the raw material solution with a laser beam. In this embodiment mode, it is preferable to use crystalline semiconductor particles, and as a semiconductor, silicon, germanium, silicon germanium, or the like can be applied.

As shown in FIG. 9, the aerosol laser ablation apparatus includes an aerosol generator 201 that generates aerosol from micron-size crystalline semiconductor particles; a neutralizer 202 that charges the micron-size crystalline semiconductor particles using radiation as well as prevents the crystalline semiconductor particles from being adsorbed by an inner wall of a pipe when passing therethrough; a laser light source 206 that irradiates the aerosol with a laser beam; and an ablation chamber 203 that generates nanoparticles by irradiating micron-size crystalline semiconductor particles flowing in from the aerosol generator 201 with a laser beam. As a carrier gas of the crystalline semiconductor particles, helium gas, nitrogen gas, argon gas, or the like can be used.

The laser beam is introduced from a laser beam introduction window 207 that is provided for the ablation chamber 203. In order for the laser beam to efficiently act on the crystalline semiconductor particles that are aerosolized and supplied, the laser beam that has penetrated is reflected off a mirror 208 and is made to be introduced to the ablation chamber 203 again. As a laser light source, it is preferable to use an excimer laser as an ultraviolet laser, and in addition, a high power solid laser can also be used.

Nanoparticles of a crystalline semiconductor which are generated in the ablation chamber 203 passes through a size sorter 204 that separates particles of several hundred nanometers or larger, by utilizing difference in kinetic energy according to size of the nanoparticles. Semiconductor particles of several nanometers to several hundred nanometers that have passed thorough the size sorter 204 accumulate over the substrate 101 placed in a sample chamber 205.

Figure 10:
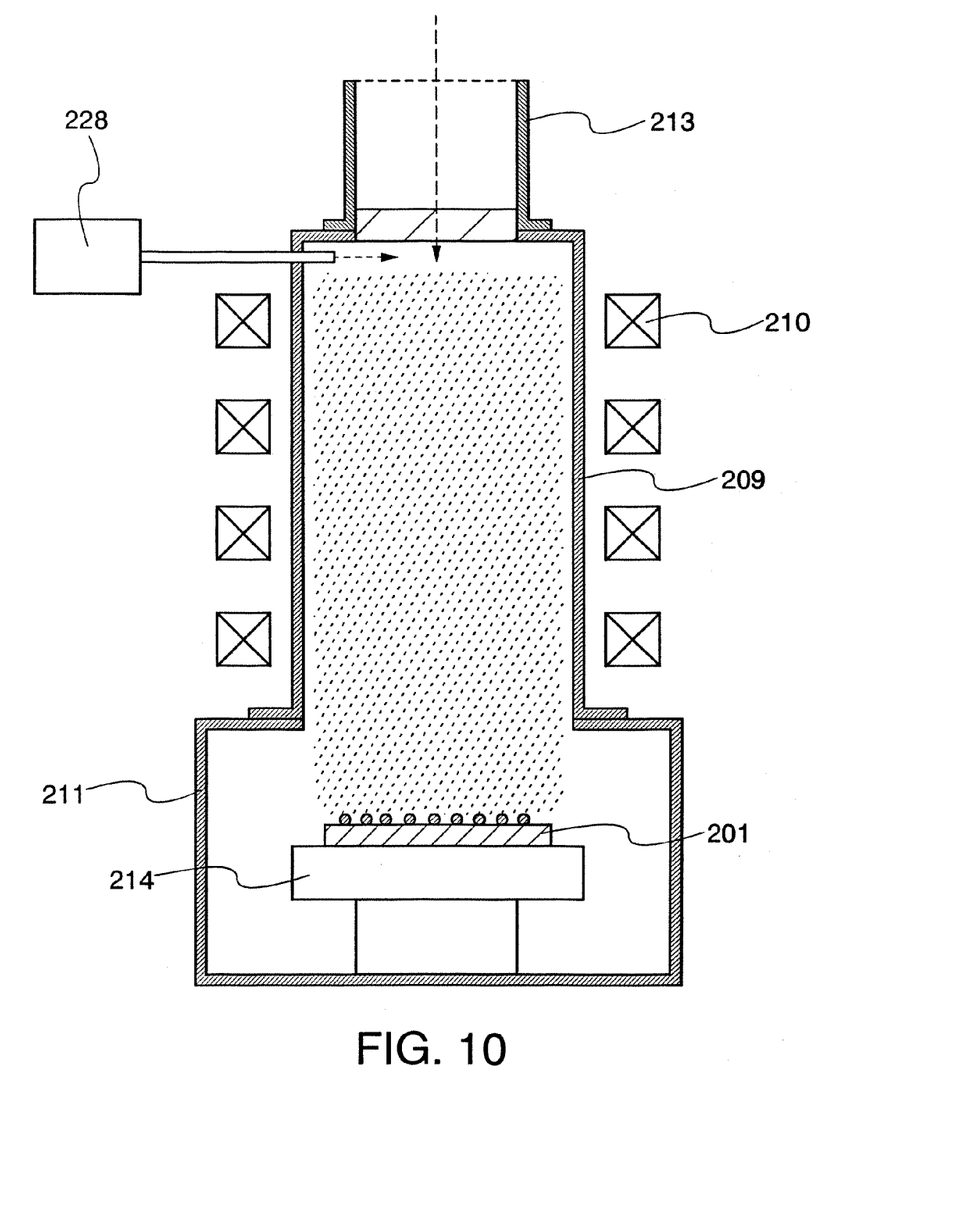
FIG. 10 shows a structure of a vapor growth apparatus for generating crystalline semiconductor particles.

Also, FIG. 10 shows a chemical vapor growth (CVD) apparatus utilizing electron cyclotron resonance (ECR), and semiconductor particles can also be generated by such an apparatus. In this apparatus, a cavity resonator 209 is attached to a sample chamber 211. Coils 210 for direct-current field generation are attached to the cavity resonator 209. A waveguide 213 is connected to the cavity resonator 209, and microwave is supplied from a quartz window that transmits microwave. A raw material gas such as silane or disilane is supplied by a gas supplying means 212 from one end of the cavity resonator 209 that is away from the sample chamber 211. The substrate 101 over which the semiconductor particles are accumulated is supported by a stage 214 that is inside the sample chamber 211. The stage 214 can heat the substrate 101 to a temperature of about 100° C. to 500° C.

The crystalline semiconductor particles are manufactured under a condition in which silane gas or silane gas and hydrogen gas are supplied by the gas supplying means 212, and a reaction pressure is set at 0.1 to 0.05 Pa, a microwave power is set at 300 W to 1 kW, and strength of a resonance magnetic field is set at 875 G, for example. At this time, a propagation direction of the microwave is lengthened in the cavity resonator 209, and the raw material gas is supplied into the cavity resonator 209 from one end that is away from the sample chamber 211. Consequently, the raw material gas is broken up in the cavity resonator 209, and in a gas phase, crystalline semiconductor particles of several nanometers to several tens of nanometers can be obtained by a polymerization reaction. By adding hydrogen to silane or disilane as the raw material gas, microcrystal grains can be obtained by a surface inactivation reaction of nanoparticles that are in a gas phase.

Figure 6:
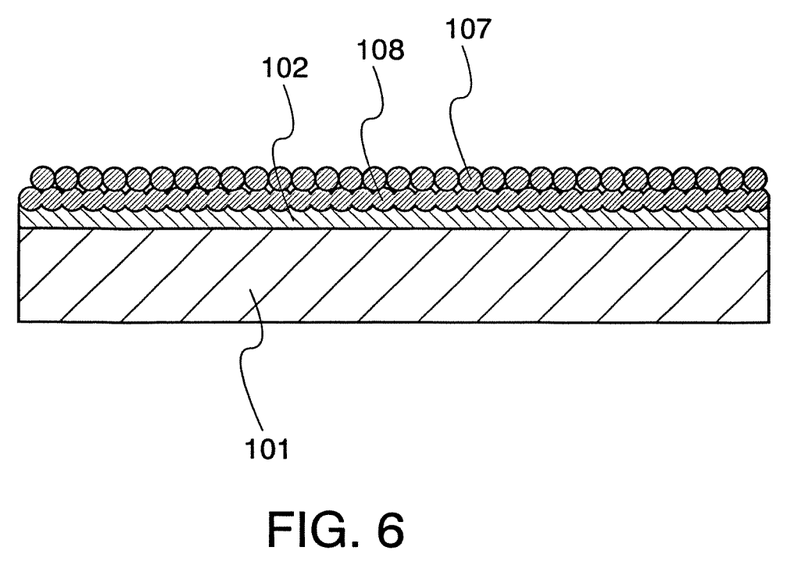
FIG. 6 describes a manufacturing step of a photoelectric conversion device of Embodiment Mode 2.

FIG. 6 shows a step of forming a crystalline semiconductor particle layer 108 by fusion-bonding the crystalline semiconductor particles 107 that have accumulated over the substrate 101. Further, a treatment by which the crystalline semiconductor particles 107 are fixed by heating the first electrode 102 through a heat treatment is also carried out. By fusion-bonding the crystalline semiconductor particles 107 to each other, an area for absorbing light increases within a substrate surface. The crystalline semiconductor particles 104 that are fusion-bonded allow diffusion of photogenerated carries to an adjacent crystalline semiconductor particle, and therefore efficiency of carrier collection is improved. That is, since the area substantively contributing to photoelectric conversion increases by this step, conversion efficiency can be improved.

The crystalline semiconductor particles 107 that have been microparticulated to several nanometers to several hundred nanometers each have a large surface area, and may come to a state where the particles are electrically fusion-bonded to each other. The subsequent step may be carried out while in this state; however, it is more preferable that a treatment of fusion-bonding by heat treatment or irradiation by a laser beam is carried out. The nanoparticles fusion-bond at a lower temperature than an inherent melting point of a material thereof; therefore, they do not have an adverse affect with respect to the first electrode 102 also. However, the treatment of fusion-bonding the crystalline semiconductor particles 107 to each other is preferably carried out by irradiation of a laser beam.

Figure 7:
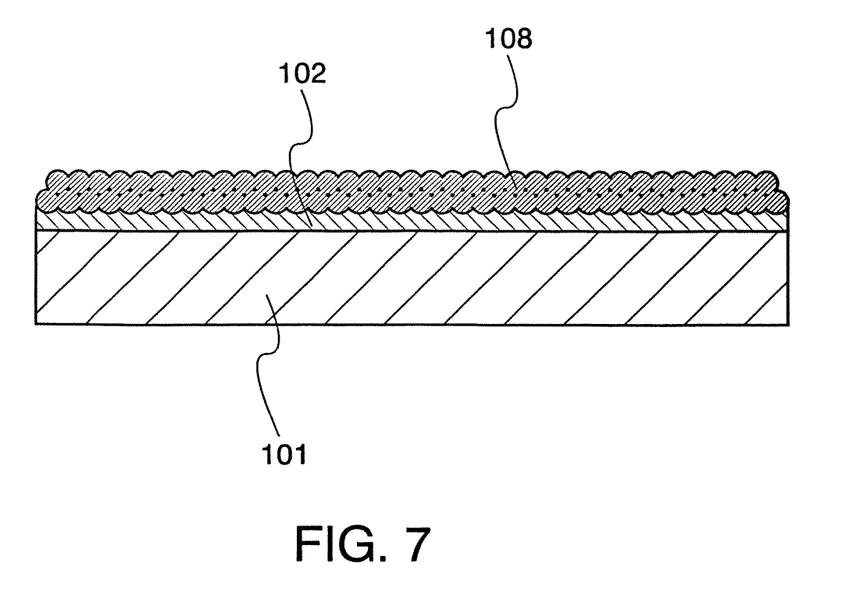
FIG. 7 describes a manufacturing step of a photoelectric conversion device of Embodiment Mode 2.

In a case of making a photoelectric conversion layer to be thicker with the crystalline semiconductor particle layer 108 that is fusion-bonded, the crystalline semiconductor particles 107 are accumulated even more by an aerosol laser ablation method, a pyrolysis method, or a vapor growth method, and then a treatment of fusion-bonding the crsytalline semiconductor particles is carried out. By repeating such a step, a photoelectric conversion layer of a desired thickness can be formed using the crsytalline semiconductor particle layer 108 that is fusion-bonded, as shown in FIG. 7.

Figure 8:
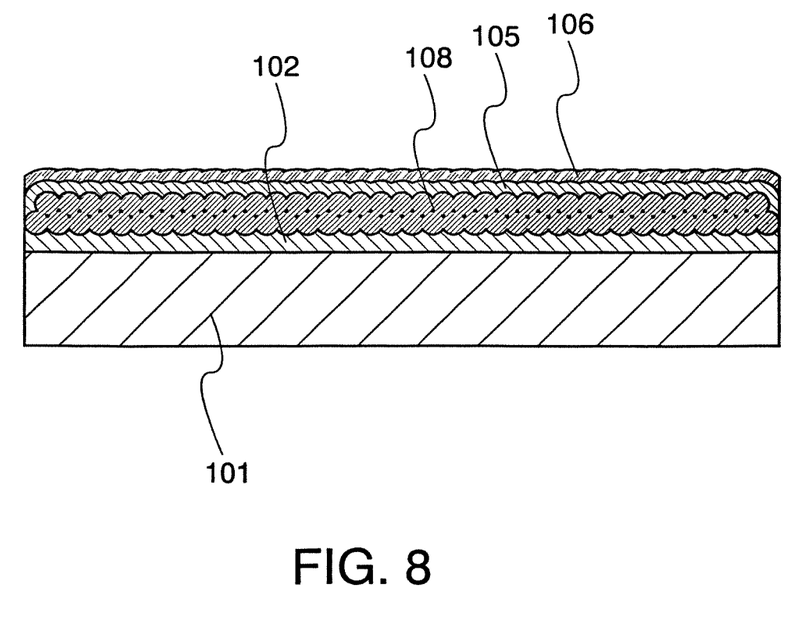
FIG. 8 describes a manufacturing step of a photoelectric conversion device of Embodiment Mode 2.

FIG. 8 shows a step of forming the n-type semiconductor layer 105 and the second electrode 106 over the crystalline semiconductor particle layer 108 that is fusion-bonded. The n-type semiconductor layer 105 is formed of polycrystalline silicon, microcrystalline silicon, amorphous silicon or the like doped with phosphor (P) or the like. The n-type semiconductor layer 105 is formed to have a thickness of 10 nm to 100 nm, and by this, a p-n junction is formed.

Over the n-type semiconductor layer 105, the second electrode 106 is formed. The second electrode 106 may be formed with a transparent conductor film made of indium oxide, indium tin oxide, zinc oxide, or the like. Alternatively, the second electrode 106 may be formed as a comb-shaped metal electrode. In this manner, the photoelectric conversion device can be obtained.

In the photoelectric conversion device of this embodiment mode, movement of carriers in a lateral direction is not inhibited in the layer formed of the crystalline semiconductor particles 107, and a significant effect is obtained where there is not much difference compared to a case of forming this layer of a single monocrystalline silicon layer. Also, by forming a p-n junction by retaining a shape of the crystalline semiconductor particles of several hundred nanometers, asperity of a surface becomes about the same as a wavelength of light absorbed by the semiconductor, and reflection of incident light can be suppressed. In other words, reflectance loss of light can be suppressed.

(Embodiment Mode 3)

Figure 11:
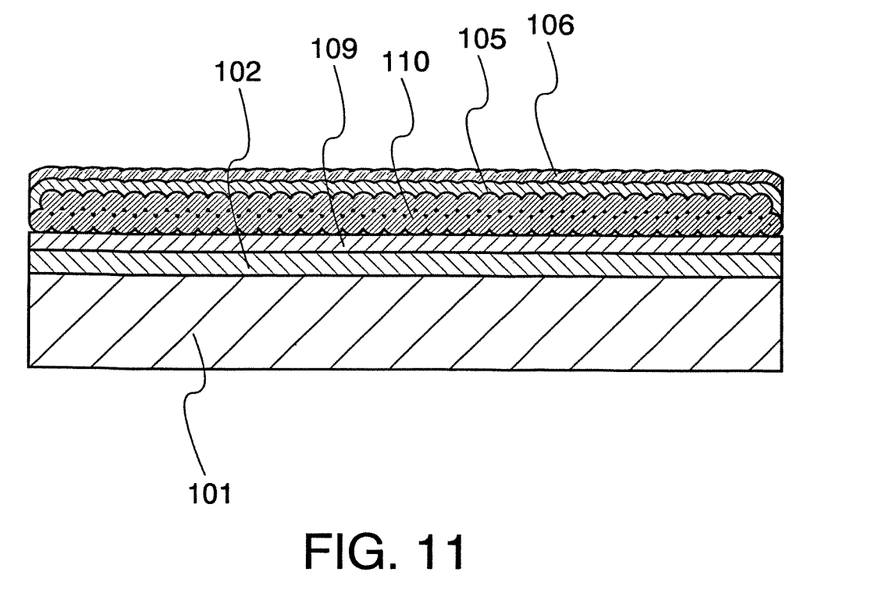
FIG. 11 describes a manufacturing step of a photoelectric conversion device of Embodiment Mode 3.

In this embodiment mode, an intrinsic semiconductor is used for crystalline semiconductor particles, and FIG. 11 shows a photoelectric conversion device in which a so-called pin junction is formed. Note that the intrinsic semiconductor mentioned here refers to a semiconductor in which a concentration of an impurity therein imparting p-type or n-type is $1 \times 10^{20}$ cm$^{-3}$ or lower, a concentration of oxygen and nitrogen are each $9 \times 10^{19}$ cm$^{-3}$ or lower, and of which a photoconductivity is 1000 times a dark conductivity or more. Further, 10 to 1000 ppm of boron (B) may be added to this intrinsic semiconductor.

In FIG. 11, the first electrode 102 is formed over the substrate 101, and then a one-conductivity type semiconductor layer 109 is formed thereover. For example, a p-type semiconductor layer is formed by a plasma CVD method. The one-conductivity type semiconductor layer 109 may be of a microcrystalline semiconductor. Then, crystalline semiconductor particles 110 are formed as the intrinsic semiconductor thereover, in a similar manner to Embodiment Mode 1 or 2. Although one-conductivity type crystalline semiconductor particles are used in Embodiment Modes 1 and 2, these may be replaced with intrinsic crystalline semiconductor particles. In this case also, the intrinsic crystalline semiconductor particles are formed so that at least adjacent particles are fusion-bonded to each other. Then, the n-type semiconductor layer 105 and the second electrode 106 are formed thereover to obtain a photoelectric conversion device.

Note that in this embodiment mode, although a metal electrode can be applied as the first electrode 102, and a transparent electrode can be applied as the second electrode 106, electrode forming materials may be interchanged so that a structure may be that of allowing entrance of light from the first electrode. By having a structure in which light is allowed entrance from a p-type semiconductor layer, diffusion length of holes can be made to be short, and conversion efficiency can be improved.

According to this embodiment mode, conversion efficiency can be improved by forming a pin junction. Since crystalline semiconductor particles that play a central role in photoelectric conversion have crystalline structures, lifetime of a minority carrier is long, and extraction efficiency of photogenerated carriers can be improved. Further, there is no problem of light deterioration, like how it becomes a problem particularly when using amorphous silicon, and reliability can be improved.

Note that this embodiment mode can be carried out in free combination with Embodiment Mode 1 or 2.

Since a junction region of the photoelectric conversion device shown in Embodiment Mode 1 to 3 can be formed on a light-accepting surface, conversion efficiency is high because efficiency of carrier collection is favorable. In particular, since a p-n junction is formed while retaining a shape of the crystalline semiconductor particles, area of light acceptance substantively contributing to photoelectric conversion is increased, which contributes to improving conversion efficiency.

Note that although in Embodiment Modes 1 and 2, the crystalline semiconductor particles are p-type, and a step is described where an n-type semiconductor layer is formed after forming the crystalline semiconductor particles, a combination may be reversed. In other words, the crystalline semiconductor particles may be n-type, and a p-type semiconductor layer maybe formed thereafter.

Note that although in Embodiment Modes 1 and 2, a step is described where a first electrode, crystalline semiconductor particles, a semiconductor layer, and a second electrode are formed in this order, the order may be changed. In other words, a first electrode, a semiconductor layer, crystalline semiconductor particles, and a second electrode may be formed in this order.

As described above, the modes of a photoelectric conversion device shown below can be derived according to the present invention.

A photoelectric conversion device includes one-conductivity type crystalline semiconductor particles, of which adjacent particles are fusion-bonded to each other and of which a portion is in contact with a first electrode; a semiconductor layer for forming a junction with the one-conductivity type crystalline semiconductor particles, that has an opposite conductivity type to the one-conductivity type; and a second electrode formed thereover.

A photoelectric conversion device includes a one-conductivity type crystalline semiconductor particle layer, of which a portion is in contact with a first electrode, and is formed by stacking a plurality of crystalline semiconductor particles of which adjacent particles are fusion-bonded to each other; a semiconductor layer for forming a junction with the one-conductivity type crystalline semiconductor particle layer, that has an opposite conductivity type to the one-conductivity type; and a second electrode formed over the semiconductor layer.

A photoelectric conversion device including a one-conductivity type semiconductor layer formed over a first electrode; crystalline semiconductor particles of which adjacent particles are fusion-bonded to each other, formed over the one-conductivity type semiconductor layer; a semiconductor layer formed over the crystalline semiconductor particles, that has an opposite conductivity type to the one-conductivity type; and a second electrode formed over the semiconductor layer that has the opposite conductivity type to the one-conductivity type.

A manufacturing method of a photoelectric conversion device including a step of densely dispersing one-conductivity type crystalline semiconductor particles over a first electrode; a step of heating the first electrode to fix the crystalline semiconductor particles to the first electrode; a step of fusion-bonding adjacent crystalline semiconductor particles to each other; a step of forming a semiconductor layer over the crystalline semiconductor particles that are fusion-bonded, that has an opposite conductivity type to the one-conductivity type; and a step of forming a second electrode over the semiconductor layer that has the opposite conductivity type to the one-conductivity type.

A manufacturing method of a photoelectric conversion device including a step of densely dispersing one-conductivity type crystalline semiconductor particles over a first electrode; a step of heating the first electrode to fix the crystalline semiconductor particles to the first electrode; a step of forming a crystalline semiconductor particle layer by fusion-bonding adjacent crystalline semiconductor particles to each other; a step of carrying out once or a plurality of times a treatment of dispersing and fusion-bonding crystalline semiconductor particles over the crystalline semiconductor particle layer; a step of forming a semiconductor layer over the crystalline semiconductor particle layer, that has an opposite conductivity type to the one-conductivity type; and a step of forming a second electrode over the semiconductor layer that has the opposite conductivity type to the one-conductivity type.

A manufacturing method of a photoelectric conversion device including a step of forming a one-conductivity type semiconductor layer over a first electrode; a step of forming intrinsic crystalline semiconductor particles over the one-conductivity type semiconductor layer; a step of fusion-bonding the intrinsic crystalline semiconductor particles; a step of forming a semiconductor layer over the crystalline semiconductor particles that are fusion-bonded, that has an opposite conductivity type to the one-conductivity type; and a step of forming a second electrode over the semiconductor layer that has the opposite conductivity type to the one-conductivity type.

As the modes of a photoelectric conversion device described above, the present invention applies not only a photoelectric conversion device, but also a circuit element included in an integrated circuit. The present invention is a semiconductor device which includes at least a first electrode, crystalline semiconductor particles of which adjacent particles are fusion-bonded, a semiconductor layer, and a second electrode. The semiconductor device applies, for example, a diode included in an integrated circuit.

This application is based on Japanese Patent Application serial no. 2006-009945 filed in Japan Patent Office on January 18 in 2006, the entire contents of which are hereby incorporated by reference.

What is claimed is:

1. A semiconductor device comprising:
   a first electrode,
   a layer including crystalline semiconductor particles over the first electrode, wherein the crystalline semiconductor particles are collected on the first electrode, a plurality of crystalline semiconductor particles are in direct contact with one or more adjacent crystalline semiconductor particles, and surfaces of the crystalline semiconductor particles are made to be in a fusion state for a period of time resulting in the fusion bonding of adjacent crystalline semiconductor particles to each other without a boundary between two crystalline semiconductor particles at the point of fusion bonding,
   a semiconductor layer over the layer including the crystalline semiconductor particles, and
   a second electrode over the semiconductor layer,
   wherein:
   the crystalline semiconductor particles have a first conductivity type, and
   the semiconductor layer has a second conductivity type which is different from the first conductivity type.

2. The semiconductor device according to claim 1, wherein the first electrode includes a material selected from the group consisting of aluminum, indium, tin, zinc and a combination thereof.

3. The semiconductor device according to claim 1, wherein each of the crystalline semiconductor particles includes silicon, germanium, or silicon-germanium.

4. The semiconductor device according to claim 1, wherein a grain diameter of each of the crystalline semiconductor particles is 1 micrometer to 99 micrometers.

5. The semiconductor device according to claim 1, wherein a grain diameter of each of the crystalline semiconductor particles is 1 nanometer to 999 nanometers.

6. The semiconductor device according to claim 1, wherein the semiconductor layer includes polycrystalline silicon, microcrystalline silicon, or amorphous silicon.

7. The semiconductor device according to claim 1, wherein the second electrode includes indium oxide, indium tin oxide, or zinc oxide:

8. A semiconductor device comprising:
   a first electrode,
   a layer including crystalline semiconductor particles over the first electrode, wherein the crystalline semiconductor particles are collected on the first electrode, a plurality of crystalline semiconductor particles are in direct contact with one or more adjacent crystalline semiconductor particles, surfaces of the crystalline semiconductor particles are made to be in a fusion state for a period of time resulting in the fusion bonding of adjacent crystalline semiconductor particles to each other without a boundary between two crystalline semiconductor particles at the point of fusion bonding, and at least two crystalline semiconductor particles are stacked,
   a semiconductor layer over the layer including the crystalline semiconductor particles, and
   a second electrode over the semiconductor layer,
   wherein:
   the crystalline semiconductor particles have a first conductivity type, and
   the semiconductor layer has a second conductivity type which is different from the first conductivity type.

9. The semiconductor device according to claim 8, wherein the first electrode includes a material selected from the group consisting of aluminum, indium, tin, zinc and a combination thereof.

10. The semiconductor device according to claim 8, wherein each of the crystalline semiconductor particles includes silicon, germanium, or silicon-germanium.

11. The semiconductor device according to claim 8, wherein a grain diameter of each of the crystalline semiconductor particles is 1 micrometer to 99 micrometers.

12. The semiconductor device according to claim 8, wherein a grain diameter of each of the crystalline semiconductor particles is 1 nanometer to 999 nanometers.

13. The semiconductor device according to claim 8, wherein the semiconductor layer includes polycrystalline silicon, microcrystalline silicon, and amorphous silicon.

14. The semiconductor device according to claim 8, wherein the second electrode includes indium oxide, indium tin oxide, or zinc oxide.

15. A semiconductor device comprising:
    a first electrode,
    a first semiconductor layer over the first electrode,
    a layer including crystalline semiconductor particles over the first semiconductor layer, wherein the crystalline semiconductor particles are collected on the first electrode, a plurality of crystalline semiconductor particles are in direct contact with one or more adjacent crystalline semiconductor particles, and surfaces of the crystalline semiconductor particles are made to be in a fusion state for a period of time resulting in the fusion bonding of adjacent crystalline semiconductor particles to each other without a boundary between two crystalline semiconductor particles at the point of fusion bonding, a second semiconductor layer over the layer including the crystalline semiconductor particles, and a second electrode over the second semiconductor layer, wherein:

the first semiconductor layer has a first conductivity type, and the second semiconductor layer has a second conductivity type which is different from the first conductivity type.

16. The semiconductor device according to claim 15, wherein the first electrode includes a material selected from the group consisting of aluminum, indium, tin, zinc and a combination thereof.

17. The semiconductor device according to claim 15, wherein each of the crystalline semiconductor particles includes of silicon, germanium, or silicon-germanium.

18. The semiconductor device according to claim 15, wherein a grain diameter of each of the crystalline semiconductor particles is 1 micrometer to 99 micrometers.

19. The semiconductor device according to claim 15, wherein a grain diameter of each of the crystalline semiconductor particles is 1 nanometer to 999 nanometers.

20. The semiconductor device according to claim 15, wherein the first semiconductor layer includes polycrystalline silicon, microcrystalline silicon, and amorphous silicon.

21. The semiconductor device according to claim 15, wherein the second semiconductor layer includes polycrystalline silicon, microcrystalline silicon, and amorphous silicon.

22. The semiconductor device according to claim 15, wherein the second electrode includes indium oxide, indium tin oxide, or zinc oxide.

* * * * *

UNITED STATES PATENT AND TRADEMARK OFFICE
CERTIFICATE OF CORRECTION

PATENT NO.        : 8,729,386 B2
APPLICATION NO.   : 13/252292
DATED             : May 20, 2014
INVENTOR(S)       : Yasuyuki Arai It is certified that error appears in the above-identified patent and that said Letters Patent is hereby corrected as shown below:

In the Claims

Column 9, Claim 1, line 55, "of fusion bonding" should read --of the fusion bonding--.

Column 10, Claim 7, line 45, "oxide:" should read --oxide.--.

Column 10, Claim 8, line 28, "of fusion bonding" should read --of the fusion bonding--.

Column 11, Claim 15, line 3, "of fusion bonding" should read --of the fusion bonding--.

Signed and Sealed this
Seventh Day of October, 2014

Michelle K. Lee
*Deputy Director of the United States Patent and Trademark Office*